United States Patent [19]

Horiki et al.

[11] Patent Number: 4,764,421
[45] Date of Patent: Aug. 16, 1988

[54] MASKING MEMBER

[75] Inventors: Seinosuke Horiki; Reiji Makino, both of Nagoya, Japan

[73] Assignee: Nagoya Oilchemical Co., Ltd., Japan

[21] Appl. No.: 61,700

[22] Filed: Jun. 12, 1987

[30] Foreign Application Priority Data

Jun. 13, 1986 [JP] Japan .................. 61-090802[U]
Feb. 20, 1987 [JP] Japan .................. 62-024316[U]
Feb. 20, 1987 [JP] Japan .................. 62-024318[U]

[51] Int. Cl.$^4$ ........................... B32B 1/00; B32B 3/26
[52] U.S. Cl. ........................... 428/35; 428/40; 428/43; 428/317.3; 428/343; 428/352
[58] Field of Search ............ 428/35, 40, 43, 317.3, 428/343, 352

[56] References Cited

U.S. PATENT DOCUMENTS 3,262,827 7/1966 Kallander et al. ........... 428/317.3
4,470,508 9/1984 Yen ........................... 428/40

FOREIGN PATENT DOCUMENTS 747341 11/1966 Canada ........................ 428/40

Primary Examiner—William J. Van Balen
Attorney, Agent, or Firm—Cooper & Dunham

[57] ABSTRACT

A new masking member comprising a body having a vessel form consisting of a bottom and wall(s) which extend(s) upwards from the perimeter of said bottom, with said body made of a thermoplastic foam, and an adhesive layer formed on the under surface of said body is presented. When said masking member is used, said masking member is attached to a part of the surface of an article which is necessary to be protected from a surface treatment. After said surface treatment, said masking member may be removed from said part of said article by heating and softening or by a hook.

10 Claims, 6 Drawing Sheets

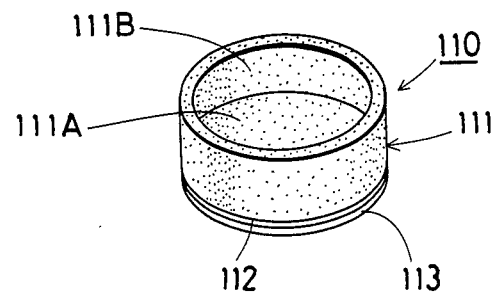
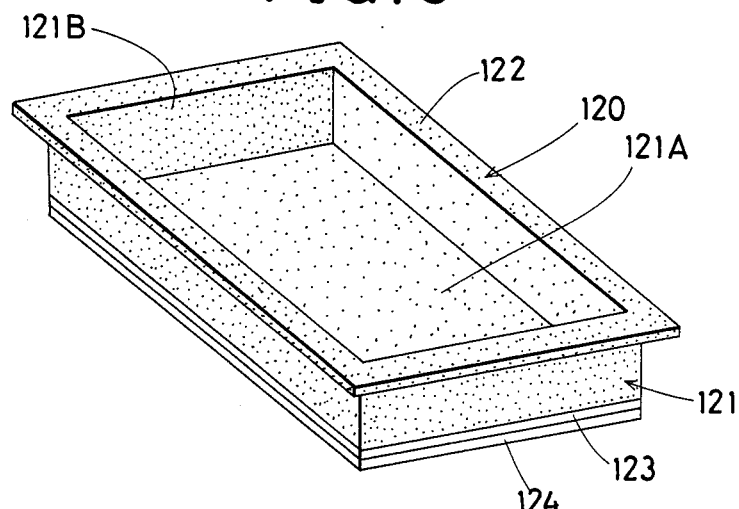
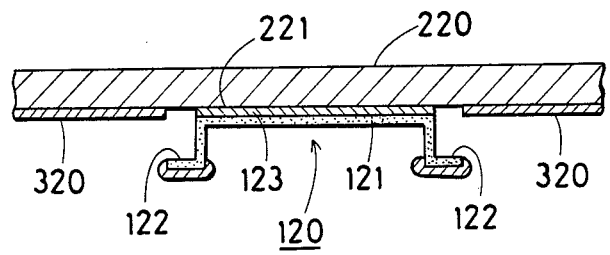

MASKING MEMBER

BACKGROUND OF THE INVENTION

The present invention relates to a new masking member used to protect a part of an article from a surface treatment such as coating, plating phosphatizing, vacuum evaporation and the like. More particularly, the present invention relates to a new masking member comprising a body having a vessel form consisting of a bottom and wall(s) which extend(s) upwards from the perimeter of said bottom, with said body made of a thermoplastic foam, and an adhesive layer formed on the under surface of said body.

In a case where the surface treatment is effected on the surface of an article, said surface of said article often has part(s) to be protected from said surface treatment. For instance, said surface of said article may have part(s) to which parts such as bolts, nuts, brackets, frames, is/are attached and said surface treatment layer may sometimes obstruct the firm attaching of said parts. Therefore, it is necessary to protect such part(s) by masking member(s) and then said surface treatment is effected on said surface of said article. After said surface treatment, said masking member(s) may be removed from said surface.

DESCRIPTION OF THE PRIOR ART

Hitherto, adhesive tape has been used as a masking member to protect a part of an article from a surface treatment, such as coating, plating, phosphatizing, vacuum evaporations and the like. Namely, the adhesive tape is attached to a part of an article to protect it from said surface treatment and after said surface treatment, said adhesive tape is removed from part of said article. Said part is not affected by said surface treatment since said part was covered with said adhesive tape during said surface treatment.

Nevertheless, said adhesive tape as a masking member has faults. In cases where the part to be protected from said surface treatment is wide, it is troublesome to attach adhesive tape to the part to be protected and remove said adhesive tape from said part since a number of strips of adhesive tape must be attached to said part to cover the whole part, and further, in cases where adhesive tape is subjected to heat, said adhesive tape may stick to said part due to heating and the removing of said adhesive tape becomes very difficult.

Still further, adhesive tape attached to the part to be protected is buried in said surface treatment layer and it is very difficult to find said buried adhesive tape and, of course, it is very difficult to remove said buried adhesive tape.

An improved masking member has been also presented. Said improved masking member is a panel consisting of a thermoplastic foam having an adhesive layer on one side. Said masking member may be attached to a part of the surface of an article which is necessary to be protected from a surface treatment by said adhesive layer of said masking member. Said panel of said masking member may have a proper size corresponding to the part of said article which is necessary to be protected from said surface treatment.

Therefore, the problem presented when a number of strips of adhesive tape attached to said part to cover the whole part, may be solved. Further, as said panel of said masking member may be thick, said masking member is not buried in said surface treatment layer and is easily found. Nevertheless, the surface treatment layer is continuously formed over said masking member and when said masking member is removed, said surface treatment layer may obstruct the smooth removing of said masking member.

SUMMARY OF THE INVENTION

Accordingly, an object of the present invention is to save trouble when the masking member is attached/removed to/from said part(s) of the surface of the article which is necessary to be protected from a surface treatment.

According to the present invention, there is provided a masking member comprising a body having a vessel form consisting of a bottom and wall(s) which extend(s) upwards from the perimeter of said bottom, with said body made of a thermoplastic foam, and an adhesive layer formed on the under surface of said body. When said masking member is used, said masking member is attached to the part of the surface of the article which is necessary to be protected from a surface treatment.

The body of the masking member is made of a thermoplastic foam, such as a polystyrene foam, a polyethylene foam, a polypropylene foam and the like and said body may be colored by a suitable color if desired, for the purpose of selection of the specified masking member according to the part to be protected.

The body of said masking member may be produced by vacuum forming from a sheet of a thermoplastic foam, the molding of expandable thermoplastic beads, and the like.

BRIEF DESCRIPTION OF THE DRAWINGS

FIG. 4 is a perspective view of a second embodiment of the present invention.

FIG. 5 is a perspective view of a third embodiment of the present invention.

FIG. 6 is a partial side sectional view of the third embodiment of the present invention after surface treatment.

DETAILED DESCRIPTION

Figure 1:
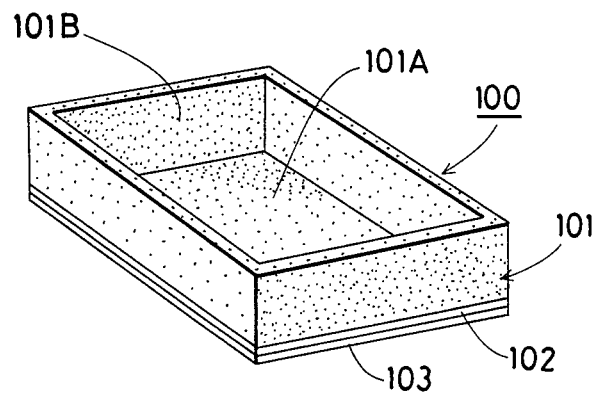
FIG. 1 is a perspective view of a first embodiment of the present invention.
Figure 2:
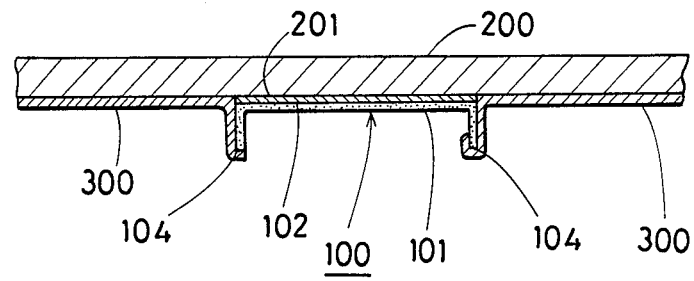
FIG. 2 is a partial side sectional view of the first embodiment of the present invention after surface treatment.
Figure 3:
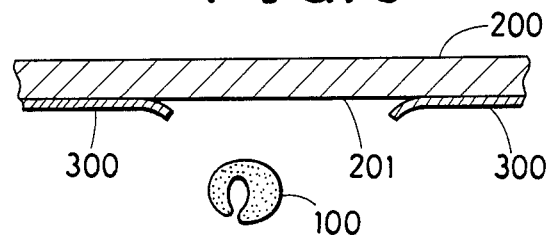
FIG. 3 is a partial side sectional view of the first embodiment of the present invention in the case of removing the masking member from the article.

FIG. 1 to FIG. 3 relate to a first embodiment of the present invention. Referring now to FIG. 1 to FIG. 3, a masking member (100) comprises a body (101) having a vessel form consisting of a rectangular bottom (101A) and perpendicular walls (101B) which extend upwards from the perimeter of said bottom (101A), with said body (101) made of a thermoplastic foam such as a polystyrene foam, a polyethylene foam, a polypropylene foam and the like. An adhesive layer (102) is formed on the under surface of said body (101) and said adhesive layer (102) is covered with a release sheet (103) such as a polyethylene film, a polypropylene film, a release paper and the like to prevent sticking to another article, the hands of workers and the like when the masking members are handled, one placed upon another, transported, and the like.

The body (101) of the masking member (100) may be colored by a suitable color if desired, for the purpose of selection of the specified masking member according to the part to be protected. The body (101) may be produced by vacuum forming from a sheet of a thermoplastic foam, the molding of expandable thermoplastic beads, and the like.

When said masking member (100) is used, said release sheet (103) is removed from said adhesive layer (102) and said masking member (100) is then attached to a part (201) of the surface of an article (200) such as the underside of the floor of cars by said adhesive layer (102) thereof, which is necessary to be protected from a surface treatment such as coating, plating, vacuum evaporation and the like. After said masking member (100) is attached to said part (201), said surface treatment is effected on the surface of said article (200) to form a film (300) of said surface treatment as shown in FIG. 2. Said part (201) of said surface of said article (200) is not subjected to said surface treatment since said part (201) is covered with said masking member (100) and said film (300) of said surface treatment may be cut by an edge (104) of the body (101) of said masking member (100). After said surface treatment, said surface-treated article (200) is heated to dry and/or cure if desired and in cases where the heating temperature is adequately higher than the softening point of the thermoplastic foam of said body (101) of said masking member (100), said masking member (100) will shrink by said heating and come off by itself from said part (201) of said surface of said article (200) as shown in FIG. 3. As said masking member (100) comprises a body having a vessel form, the volume of said shrunk masking member (100) may be much smaller than the apparent volume of the unshrunk masking member (100) and further, as above described, said film (300) of said surface treatment may be cut by an edge (104) of the body (101) of said masking member (100), the removing of said masking member (100) from said part (201) of said article (200) may be very smooth without obstruction of said film (300). Said masking member (100) may also be removed by a hook and, in this case, said masking member (100) may be easily removed without obstruction of said film (300).

FIG. 4 relates to a second embodiment of the present invention. In this embodiment, a masking member (110) comprises a body (111) having a vessel form consisting of a circular bottom (111A) and a perpendicular wall (111B) which extends upwards from the circumference of said bottom (111A), with said body (111) made of a thermoplastic foam the same as the first embodiment of the present invention. An adhesive layer (112) is formed on the under surface of said body (111) and said adhesive layer (112) is covered with a release sheet (113) the same as the first embodiment of the present invention. Further, the body of said masking member of the present invention should have a suitable form according to the part to be protected from a surface treatment.

Figure 7:
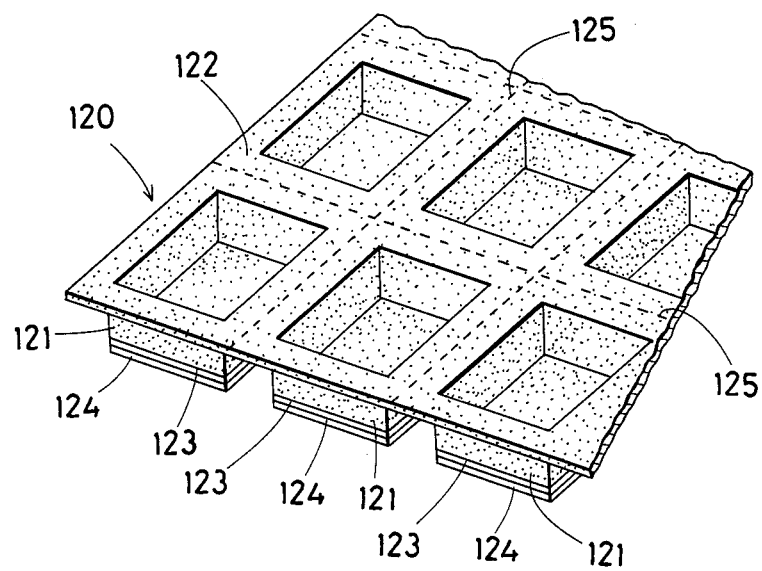
FIG. 7 is a partial perspective view of the third embodiment of the present invention in the case of said third embodiment being produced.

FIG. 5 to FIG. 7 relate to a third embodiment of the present invention. Referring now to FIG. 5 to FIG. 7, a masking member (120) comprises a body (121) having a vessel form consisting of a rectangular bottom (121A) and perpendicular walls (121B) which extend upwards from the perimeter of said bottom (121A), and a flange (122) which is extended from the upper edges of said walls (121B), with said body (121) made of a thermoplastic foam the same as the first and second embodiments of the present invention. An adhesive layer (123) is formed on the under surface of said body (121) and said adhesive layer (123) is covered with a release sheet (124) the same as the first and second embodiments of the present invention.

When said masking member (12) is used, said release sheet (124) is removed from said adhesive layer (123) and said masking member (12) is then attached to a part (221) of the surface of an article (220) which is necessary to be protected from a surface treatment. After said masking member (12) is attached to said part (221), said surface treatment is effected on said surface of said article (220) to form a film (32)) of said surface treatment as shown in FIG. 6. In this embodiment, said film (32) of said surface treatment may be more completely cut by said flange (122) of said masking member (120) than in the cases of the first and second embodiments of the present invention and, as the result, said masking member (120) may be more smoothly removed from said part (221) of said surface of said article (220).

A number of masking members (120) of this embodiment may advantageously be produced by vacuum forming from a sheet of a thermoplastic foam such as a polystyrene paper and the like as shown in FIG. 7. Referring to FIG. 7, a number of bodies (121) of masking members (120) are formed arranged in rows and lines, and each body (121) is connected to the other body (121) by the flange (122). Cutting lines (125) are formed between said flange (122) and another said flange (122) and when said masking member (120) is used, said masking member (120) is torn along said lines by hand.

Figure 8:
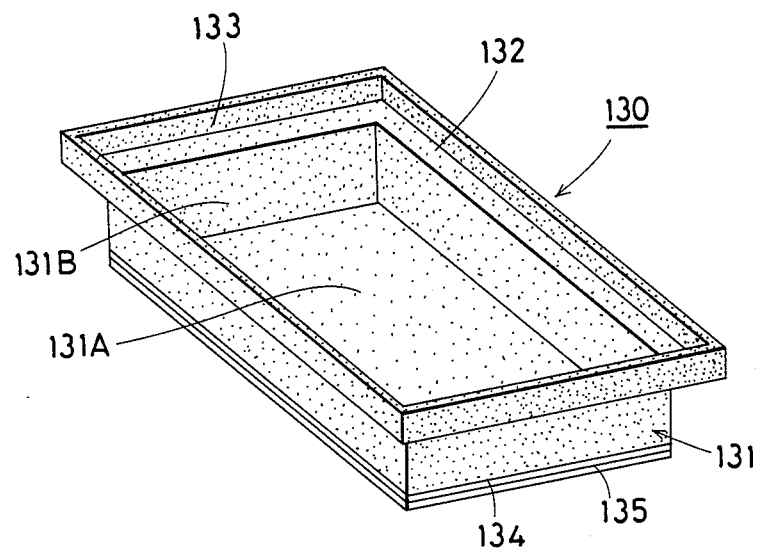
FIG. 8 is a perspective view of a fourth embodiment of the present invention.

FIG. 8 relates to a fourth embodiment of the present invention. In this embodiment a masking member (130) comprises a body (131) having a vessel form consisting of a rectangular bottom 9131A) and perpendicular walls (131B) which extend upwards from the perimeter of said bottom (131A), a flange (132) which is extended from the upper edges of said walls (131B), and perpendicular walls (133) which extend upwards from the perimeter of said flange (132), with said body (131) made of a thermoplastic foam the same as the first, second, and third embodiments of the present invention. An adhesive layer (134) is formed on the under surface of said body (131) and said adhesive layer (134) is covered with a release sheet (135) the same as the first, second, and third embodiments of the present invention. A film of a surface treatment may be more completely cut by said perpendicular walls (133) of said flange (132).

Figure 9:
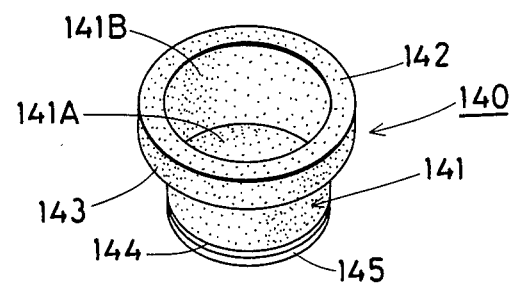
FIG. 9 is a perspective view of a fifth embodiment of the present invention.

FIG. 9 relates to a fifth embodiment of the present invention. In this embodiment, a masking member (140) comprises a body (141) having a vessel form consisting of a circular bottom (141A) and a perpendicular wall (141B) which extends upwards from the circumference of said bottom (141A), a flange (142) which is extended from the upper edges of said wall (141B), and perpendicular wall (143) which extends downwards from the circumference of said flange (142), with said body (141) made of a thermoplastic foam the same as the first, second, third and fourth embodiments of the present invention. An adhesive layer (144) is formed on the under surface of said body (141) and said adhesive layer (144) is covered with a release sheet (145) the same as the first, second, third and fourth embodiments of the present invention.

Figure 10:
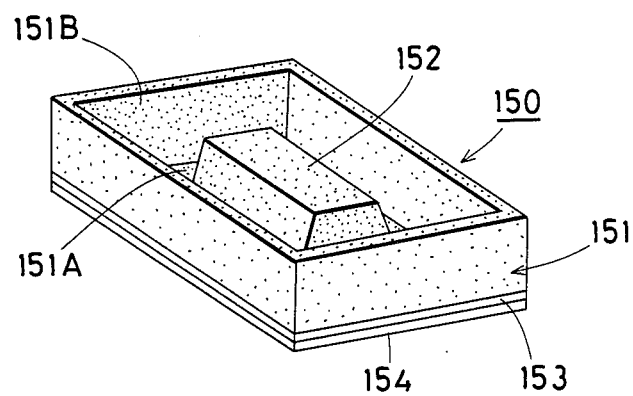
FIG. 10 is a perspective view of a sixth embodiment of the present invention.
Figure 11:
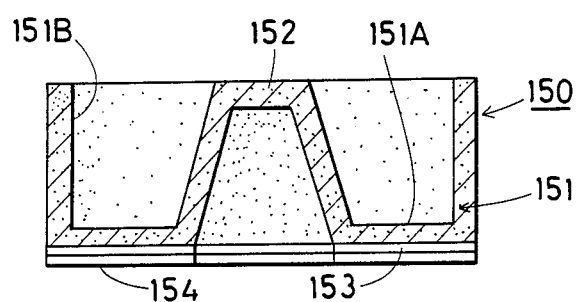
FIG. 11 is a side sectional view of the sixth embodiment of the present invention.

FIG. 10 and FIG. 11 relate to a sixth embodiment of the present invention. In this embodiment, a masking member (15) comprises a body (151) having a vessel form consisting of a rectangular bottom (151A) from which a grip (152) is risen and perpendicular walls (151B) which extend upwards from the perimeter of said bottom 9151A), with said body (151) made of a thermoplastic foam the same as the first, second, third, fourth and fifth embodiments of the present invention. An adhesive layer (153) is formed on the under surface of said body 9151) and said adhesive layer (153) is covered with a release sheet (154) the same as the first, second, third, fourth and fifth embodiments of the present invention. The masking member (15) of this embodiment is easily handled by holding said grip (152) of said masking member (15) when said masking member (150) is attached to a part of the surface of an article which is to be protected from a surface treatment and further, said masking member is easily removed by piercing said grip (152) of said masking member (150) with a hook.

Figure 12:
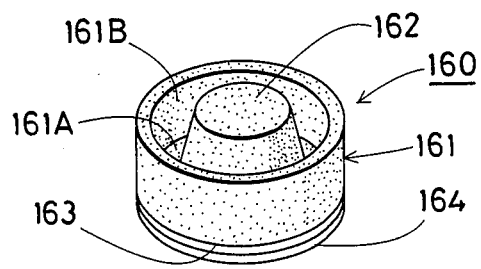
FIG. 12 is a perspective view of a seventh embodiment of the present invention.

FIG. 12 relates to a seventh embodiment of the present invention. In this embodiment, a masking member (160) comprises a body (161) having a vessel form consisting of a circular bottom (161A) from which a grip (162) is risen and perpendicular wall which extend upwards from the circumference of said bottom (161A), with said body (161) made of a thermoplastic foam the same as the first, second, third, fourth, fifth and sixth embodiments of the present invention. An adhesive layer (163) is formed on the under surface of said body (161) and said adhesive layer (163) is covered with a release sheet (164) the same as the first, second, third, fourth, fifth and sixth embodiments of the present invention.

Figure 13:
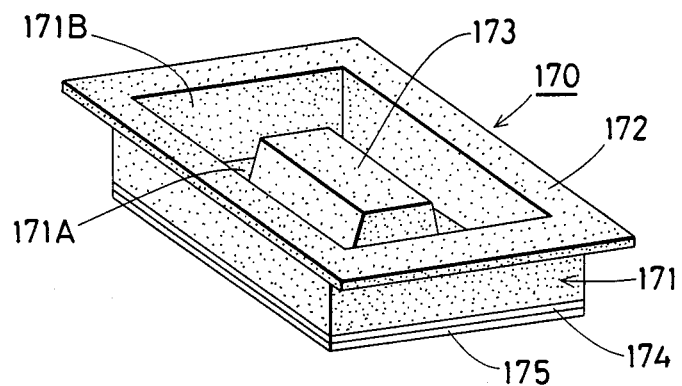
FIG. 13 is a perspective view of an eighth embodiment of the present invention.

FIG. 13 relates to an eight embodiment of the present invention. In this embodiment, a masking member (170) comprises a body (171) having a vessel form consisting of a rectangular bottom 9171A) from which a grip (173) is risen and perpendicular walls (171B) which extend upwards from the peimeter of said bottom (171A), a flange (172) which is extended from the upper edges of said walls (171B), with said body (171) made of a thermoplastic foam the same as the first, second, third, fourth, fifth, sixth and seventh embodiments of the present invention. An adhesive layer (174) is formed on the under surface of said body (171) and said adhesive layer (174) is covered with a release sheet (175) the same as the first, second, third fourth, fifth, sixth and seventh embodiments of the present invention.

Figure 14:
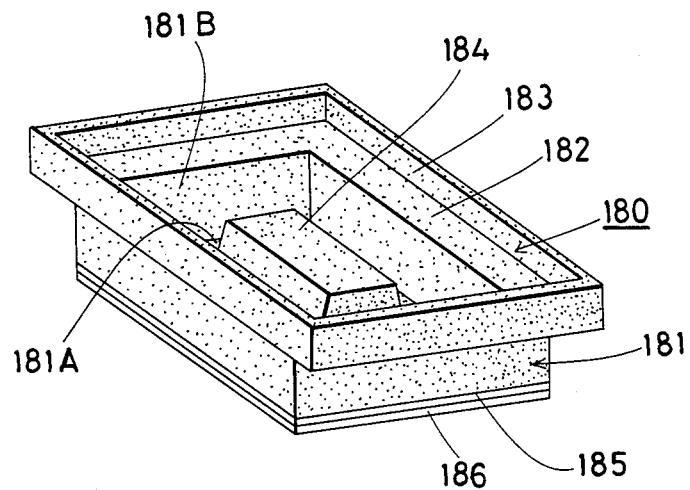
FIG. 14 is a perspective view of a ninth embodiment of the present invention.

FIG. 14 relates to a ninth embodiment of the present invention. In this embodiment, a masking member (180) comprises a body (181) having a vessel form consisting of a rectangular bottom from which a grip (184) is risen and perpendicular walls (181B) which extend upwards from the perimeter of said bottom (181A), a flange (182) which is extended from the upper edges of said walls (181B), and perpendicular walls (183) which extend upwards from the perimeter of said flange (182), with said body (181) made of a thermoplastic foam the same as the first, second, third, fourth, fifth, sixth, seventh, and eighth embodiments of the present invention. An adhesive layer (185) is formed on the under surface of said body (181) and said adhesive layer (185) is covered with a release sheet (186) the same as the first, second, third, fourth, fifth, sixth, seventh and eighth embodiments of the present invention.

Figure 15:
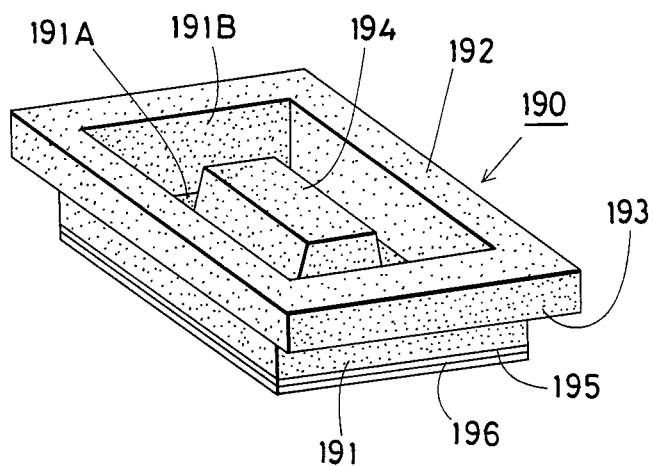
FIG. 15 is a perspective view of a tenth embodiment of the present invention.

FIG. 15 relates to a tenth embodiment of the present invention. In this embodiment, a masking member (190) comprises a body (191) having a vessel form consisting of a rectangular bottom 9191A) from which a grip is risen and perpendicular walls (191B) which extend upwards from the perimeter of said bottom (191A), a flange (192) which is extended from the upper edges of said walls (191B), and pependicular walls (193) which extend downwards from the perimeter of said flange (192), with said body (191) made of a thermoplastic foam the same as the first, second, third, fourth, fifth, sixth, seventh, eight and ninth embodiments of the present invention. An adhesive layer (195) is formed on the under surface of said body (191) and said adhesive layer (195) is covered with a release sheet (196) the same as the first, second, third, fourth, fifth, sixth, seventh, eighth and ninth embodiments of the present invention.

We claim:

1. A new masking member comprising a body having a vessel form consisting of a bottom and wall(s) which extend(s) upwards from the perimeter of said bottom, with said body made of a thermoplastic foam, and an adhesive layer formed on the under side of said bottom of said body.

2. A new masking member of claim 1, wherein a flange extends from the upper edges of the walls of said body.

3. A new masking member of claim 2, wherein said flange has perpendicular walls.

4. A new masking member of claim 1, wherein a grip is risen from the bottom of said body.

5. A new masking member of claim 4, wherein a flange is extended from the upper edges of the walls of said body.

6. A new masking member of claim 5, wherein said flange has perpendicular walls.

7. A new masking member of claim 1, wherein said body is colored by a suitable color.

8. A new masking member of claim 1, wherein said body is made of polystyrene foam.

9. A new masking member of claim 1, wherein said body is produced by vacuum forming from a sheet of a thermoplastic foam.

10. A new masking member of claim 9, wherein said sheet of a thermoplastic foam is a polystyrene paper.

* * * * *